United States Patent
Cranford, Jr. et al.

(10) Patent No.: US 7,539,473 B2
(45) Date of Patent: May 26, 2009

(54) OVERSHOOT REDUCTION IN VCO CALIBRATION FOR SERIAL LINK PHASE LOCK LOOP (PLL)

(75) Inventors: Hayden C. Cranford, Jr., Cary, NC (US); Stacy J. Garvin, Durham, NC (US); Vernon R. Norman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 450 days.

(21) Appl. No.: 11/411,662

(22) Filed: Apr. 26, 2006

(65) Prior Publication Data

US 2007/0254613 A1 Nov. 1, 2007

(51) Int. Cl.
H04B 1/18 (2006.01)

(52) U.S. Cl. .................. 455/183.1; 455/76; 455/165.1; 455/260; 327/147; 327/156

(58) Field of Classification Search ................ 455/260, 455/424, 425, 456.5, 456.6, 561, 550.1, 575.1, 455/76, 67.14, 67.11, 165.1, 183.1, 180.1, 455/208, 186.1, 190.1, 173.1, 180.3–182.3, 455/255–259, 265, 266, 75; 327/156, 147, 327/157, 159, 150, 149; 331/1 R, 44, 175, 331/177 R, 17, 14, 16, 40, 41
See application file for complete search history.

(56) References Cited

U.S. PATENT DOCUMENTS

| | | | | |
|---|---|---|---|---|
| 5,257,294 A | * | 10/1993 | Pinto et al. | 375/376 |
| 5,341,405 A | * | 8/1994 | Mallard, Jr. | 375/376 |
| 5,677,648 A | * | 10/1997 | Jones | 331/17 |
| 5,802,450 A | | 9/1998 | Horton | |
| 6,054,903 A | * | 4/2000 | Fiedler | 331/17 |
| 6,426,680 B1 | | 7/2002 | Duncan et al. | |
| 6,803,829 B2 | | 10/2004 | Duncan et al. | |
| 7,164,322 B1 | * | 1/2007 | Knotts et al. | 331/1 A |
| 2001/0020875 A1 | * | 9/2001 | Jansson | 331/44 |
| 2003/0050029 A1 | * | 3/2003 | Kaufmann et al. | 455/260 |
| 2003/0206042 A1 | * | 11/2003 | Walker et al. | 327/156 |
| 2005/0174185 A1 | * | 8/2005 | Steinbach et al. | 331/179 |
| 2005/0179501 A1 | * | 8/2005 | Natonio et al. | 331/16 |
| 2005/0264330 A1 | * | 12/2005 | Li | 327/156 |
| 2006/0267699 A1 | * | 11/2006 | Uozumi et al. | 331/17 |
| 2007/0008011 A1 | * | 1/2007 | Thurston | 326/93 |
| 2008/0100385 A1 | * | 5/2008 | Lin | 331/16 |

* cited by examiner

*Primary Examiner*—Duc Nguyen
*Assistant Examiner*—Charles Chow
(74) *Attorney, Agent, or Firm*—Dillon & Yudell LLP

(57) ABSTRACT

A circuit design, method, and system for tracking VCO calibration without requiring an over-designed divider as in conventional implementation. A filter reset component is added to the inputs of the VCO. A process step is added to the calibration mechanism/process that shorts the filter nodes and thus centers the frequency of the VCO before stepping from one frequency band to the next.

8 Claims, 8 Drawing Sheets

OVERSHOOT REDUCTION IN VCO CALIBRATION FOR SERIAL LINK PHASE LOCK LOOP (PLL)

BACKGROUND OF THE INVENTION

1. Technical Field

The present invention relates generally to electronic circuits and in particular to phase locked loop (PLL) circuits. Still more particularly, the present invention relates to calibration of the PLL circuits.

2. Description of the Related Art

Voltage controlled oscillator (VCO) calibration algorithm is utilized in the 6 Gbps harmonic oscillator for high speed serial (HSS) links. However, in electronic circuits and particularly phase locked loop (PLL) circuits, VCO calibration causes frequency overshoot. Most conventional approaches to VCO calibration do not adjust for Overshoot, which is a condition that frequently occurs during the calibration.

FIGS. 1, 3, 5, and 7 are example graphs illustrating the application of the prior art calibration algorithm to a PLL circuit. Each graph tracks the voltage (+ or − from a 0 voltage, central reference point) along the bottom X axis and the frequency band (relative to the voltage) along the right most vertical edge (Y axis). Six points of reference are shown within the graph of FIG. 1, one associated to frequency zero (F0), two associated with frequency one (F1), and three associated with frequency two (F2). Three of the points of reference are indicated with the selected frequency band assigned/selected.

In conventional designs of circuits that utilize VCO calibration, frequency overshoot caused by VCO calibration is tracked by divider circuitry to prevent erroneous lock conditions in the circuit. These conventional circuits require the divider be over-designed (i.e., built to require more power and area) in order to track the VCO. However, given the ever-present desire for smaller and lower power consuming circuits, the use of such over-designed dividers provided for correct VCO calibration is a less-than desirable fix to the problem of overshoot.

SUMMARY OF THE INVENTION

Disclosed is a circuit design, method, and system for tracking voltage controlled oscillator (VCO) calibration without requiring an over-designed divider as in conventional implementation. A filter reset component is added to the inputs of the VCO. A process step is added to the calibration mechanism/process that shorts the filter nodes and thus centers the frequency of the VCO before stepping from one frequency band to the next.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a circuit design and method for reducing overshoot in voltage controlled oscillator (VCO) calibration for high speed serial (HSS) link phase locked loop (PLL) circuits. A filter reset component is added to the inputs of the VCO. A step is added to the calibration process/mechanism that shorts the filter nodes and thus centers the frequency of the VCO before stepping from one frequency band to another. The added step reduces the requirements for the divider, which is then designed as a smaller and lower power consuming device.

Figure 1:
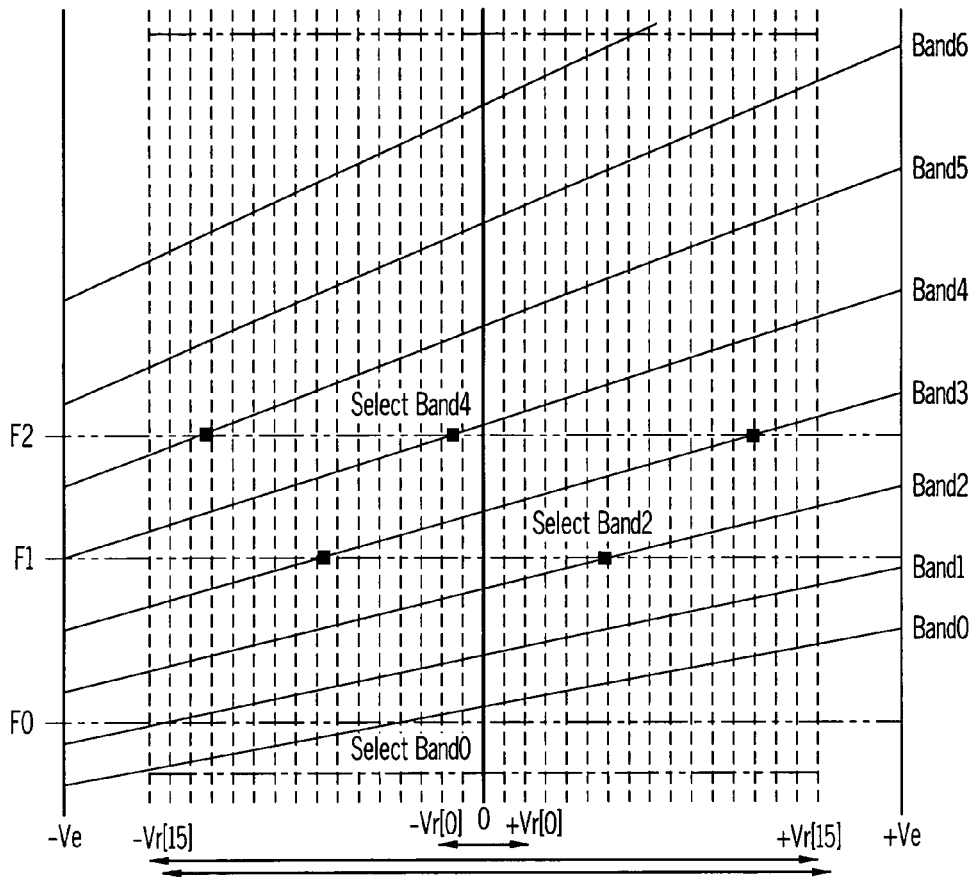
FIG. 1 is a graph matching frequencies to frequency bands plotted against required differential voltage during VCO calibration.
Figure 2:
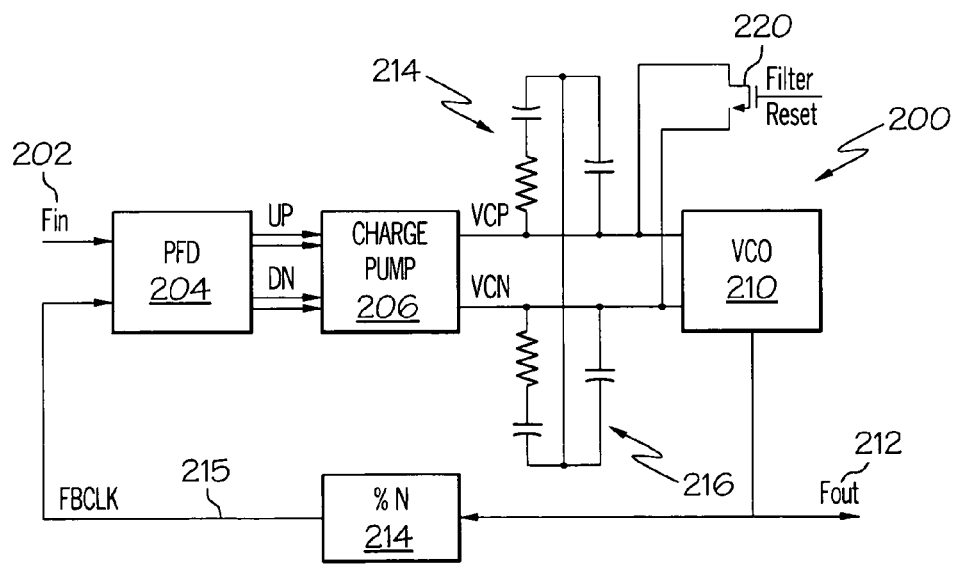
FIG. 2 is an example of the PLL with VCO calibration circuit, enhanced with a divide-by-M component and filter reset component according to one embodiment of the invention.

Referring now to the figures, and in particular FIG. 2, which provides a block diagram of a circuit designed with enhanced mechanisms for correcting frequency overshoot caused by VCO calibration without requiring an over-designed divider circuit. Specifically, the circuit illustrated represents a frequency multiplier phase locked loop (PLL). Unlike conventional implementations, the illustrated circuit of FIG. 2 comprises a filter reset (shorting) component/function 220. Additionally, the circuit 200 includes a redesigned divide-by-N (divider) 214, which is a smaller area and consumes measurably less power than conventional dividers utilized in similar circuits. Further, circuit 200 comprises a differential loop filter with positive voltage controlled branch (VCP) 214 and negative voltage controlled branch (VCN) 214.

The filter reset component 220 provides a mechanism for resetting the VCO frequency to the center point by shorting the two sides of the loop filter together. This resetting of the VCO frequency to the center point assures that the VCO frequency does not exceed the capability of the feedback divider 214, thus enabling the smaller and less power-consuming design of the feedback divider 214. In the illustrative embodiment, the reset component 220 comprises a transistor, which is coupled at the gate and source terminals to positive and negative inputs of VCO 210. Each time a band is selected, the gate of the transistor is taken to a high voltage (which shorts the transistor's sides together to a common voltage) and this operation resets the PLL to a known frequency.

During calibration, input frequency (Fin) 202 is passed through (and/or influenced by) a sequence of circuit components, namely phase frequency detector (PFD) 204, charge pump (CP)/low pass filter (LPF) 206, differential loop filter (214,216), then VCO 210 to produce an output frequency (Fout) 212. Additionally, output from VCO 210 is provided through feedback loop 215, which includes divide-by-N (divider) 214. The output of divider 214 is fed as a second input into PFD 204. As illustrated, each branch of differential loop filter (214,216) comprises a resistor and two capacitors, utilized to hold the respective lower or upper charge generated by charge pump 206. The magnitude of the voltage values between VCP and VCN determines the frequency of VCO 210. With this configuration, the present circuit 200 accurately tracks the VCO 210, while consuming less power, requiring less area on the chip/circuit board, and prevents erroneous lock conditions.

According to the described embodiment, calibration is utilized to center a VCO's operating range for optimal performance (e.g., lowest jitter) and maximum tracking for temperature changes and hot-E effects. The calibration algorithm involves the VCO operating in frequency bands. As the bands increase, the frequency increases. The bands are stepped through in increasing order to find the band that requires the least amount of differential voltage offset for the particular frequency. Each time a band is selected, the smallest selection window is applied, and the differential control voltage is examined to see if the voltage falls within this window. If none of the bands within the selection window satisfies the criteria, then the selection window is increased and the bands are stepped through again. Accordingly, this process selects the band that best centers the differential control voltage.

Figure 9:
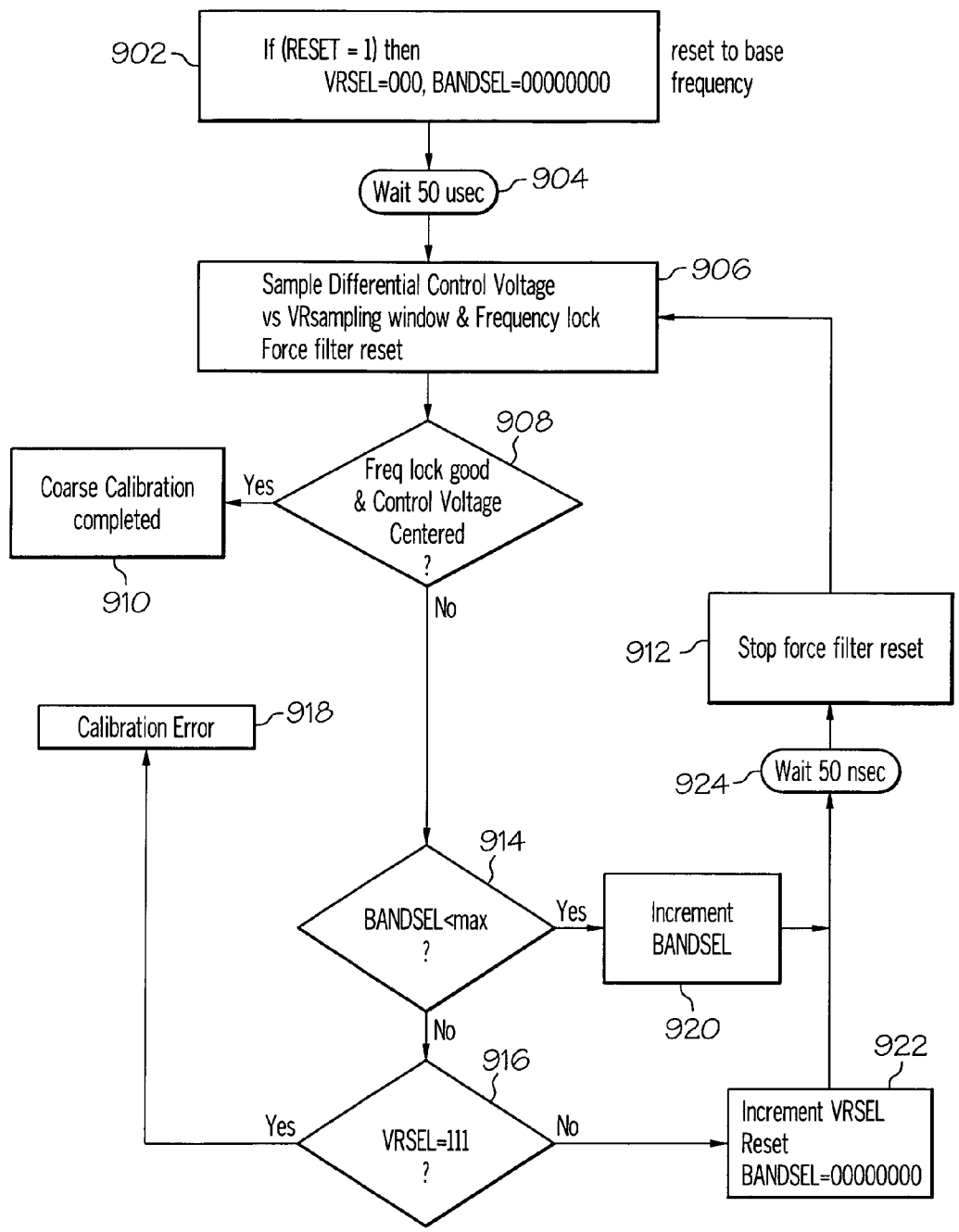
FIG. 9 is a flow chart illustrating the process by which corrections to VCO calibration is completed utilizing the enhanced methods/mechanisms provided by one embodiment of the invention.

FIG. 9 is a flow chart of the process by which overshoot in VCO calibration is substantially reduced utilizing the circuit configuration and methods/techniques of the present invention, in accordance with one embodiment. The process begins at block 902 which depicts the resetting of the circuit to a base frequency. During this reset, triggered when parameter value RESET=1, the VRSEL (i.e., the sample window select bits) are set to 000 and the BANDSEL (the present frequency band, which is controlled by an eight bit parameter) is reset 00000000. Then, as shown at block 904, the sampling process is suspended for a preset period of time (illustrated as 50 microseconds) to enable the circuit frequency to return to the center point. A new sample of the differential control voltage versus the VR sampling window and frequency lock is initiated, as shown at block 906. This also forces the filter reset.

Following, a decision is made at block 908 whether the frequency lock is okay and the control voltage is centered. If these two conditions are satisfied, then the coarse calibration of the device is completed, as shown at block 910. Otherwise, the value of the BANDSEL is checked at block 914 to determine if the value is less than the maximum frequency value. If the value is less than the maximum value, then the BANDSEL value is incremented at block 920. Then the process is made to wait another time period (shown as 50 microseconds in the illustrative embodiment) at block 924. The filter is then forced to reset at block 912 and the process returned to block 904 at which the preset wait period occurs.

Returning to block 914, if the BANDSEL is not less than the maximum, then a next check is made at block 916 whether the VRSEL equals 111, which is the maximum width. If the VRSEL value equals 111, then a calibration error is recorded as shown at block 918. Otherwise, the VRSEL value is incremented and the BANDSEL value reset to 00000000, as indicated at block 922.

With the above process, the frequency provided to the feedback divider 214 is slow enough to enable the divided to correctly divide the frequency, thus preventing the divider from being stuck in an error state. The divider 214 is designed to be able to handle the center point frequency and is thus able to follow the changes in frequency bands since the changes always begin at the "safe" center point. The invention thus implements a scheme/circuit design that provides an organized method of stepping up the VCO band frequency, while preventing the PLL from outrunning the speed capabilities of the divider utilizing the above described control algorithm.

Figure 3:
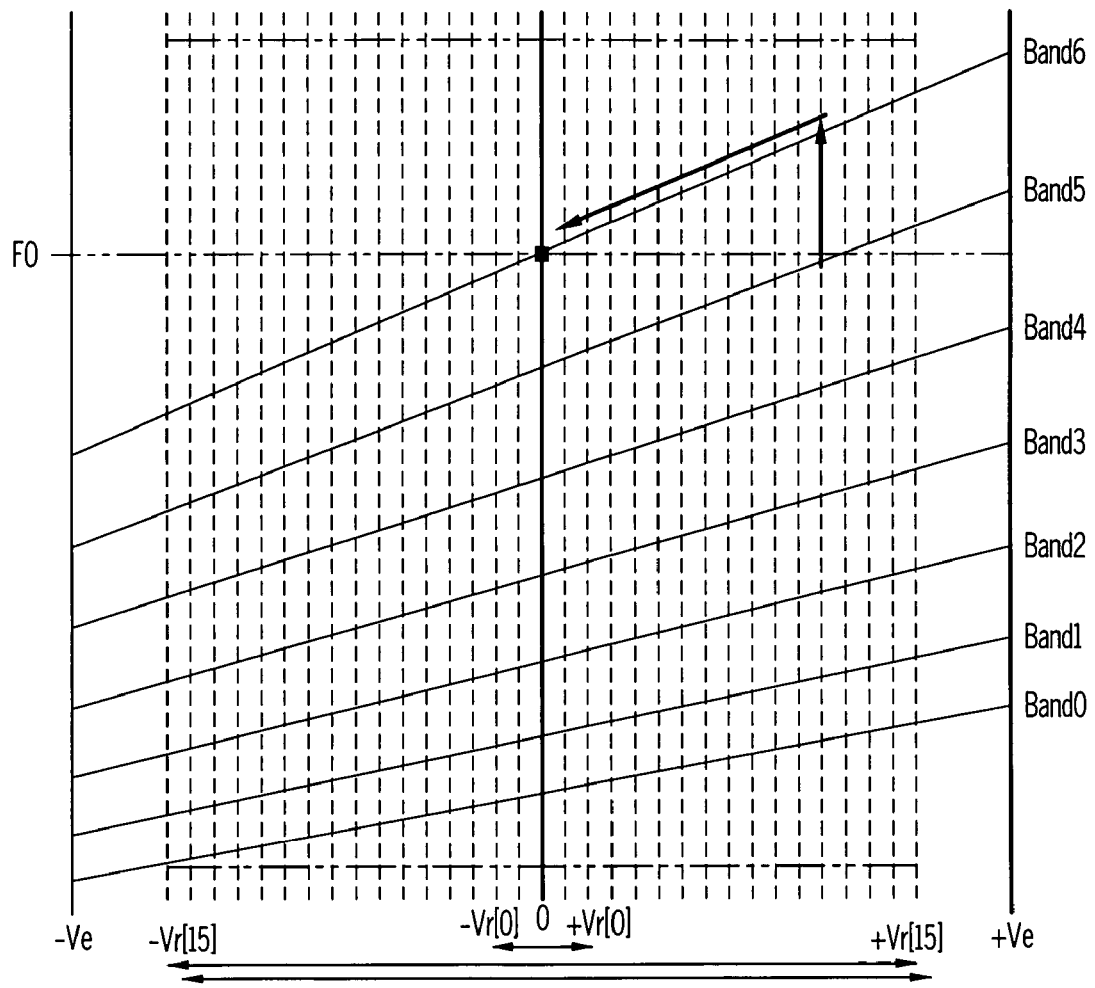
FIGS. 3, 5, and 7 illustrate frequency overshoot during VCO calibration according to conventional implementation.

Referring now to FIG. 3, wherein is illustrated the conventional methods of stepping through frequency bands during conventional VCO calibration. As shown by FIG. 3, frequency F0 was achieved on Band5 with a significantly positive differential control voltage (i.e., at the point of overlap with Band5). When the band is stepped up to Band6 (to adjust for/reduce the positive differential control voltage required), the VCO overshoots the desired frequency for some time before the phase locked loop is able to correct the overshoot. Thus one visible disadvantage of this conventional method is that when the bands are stepped up the frequency may overshoot significantly. Consequently also, divider may not be able to operate correctly at this higher frequency and may produce an irregular signal, which would cause the loop to lock at an incorrect frequency.

Figure 4:
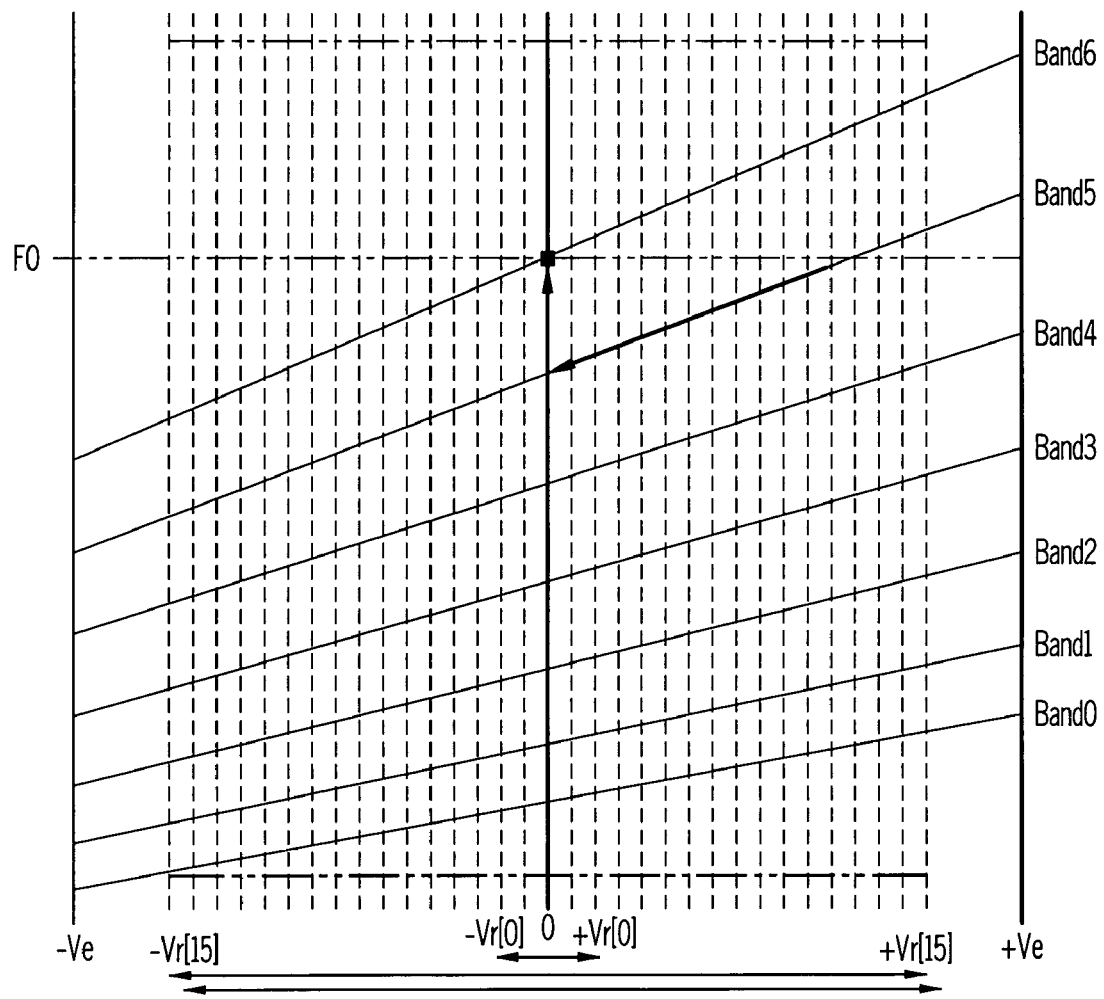
FIGS. 4, 6 and 8 illustrate corrections to the frequency overshoot/undershoot conditions of FIGS. 3, 5 and 7, respectively, during VCO calibration utilizing the method/mechanisms described within embodiments of the invention.

Recognizing the above problems with the conventional implementation, one embodiment of the invention provides a solution to the overshoot problem described above. Accordingly, as shown by the graph of FIG. 4, the methods/mechanism of the invention involves adding a step to the calibration algorithm that centers the control voltages between band steps (i.e., band5 and band6 in the illustrative embodiment). Centering the control voltages between band steps controls the maximum frequency that will be seen by the divider. In one embodiment, this centering is implemented by shorting the two sides of the differential filter with the transistor.

Figure 5:
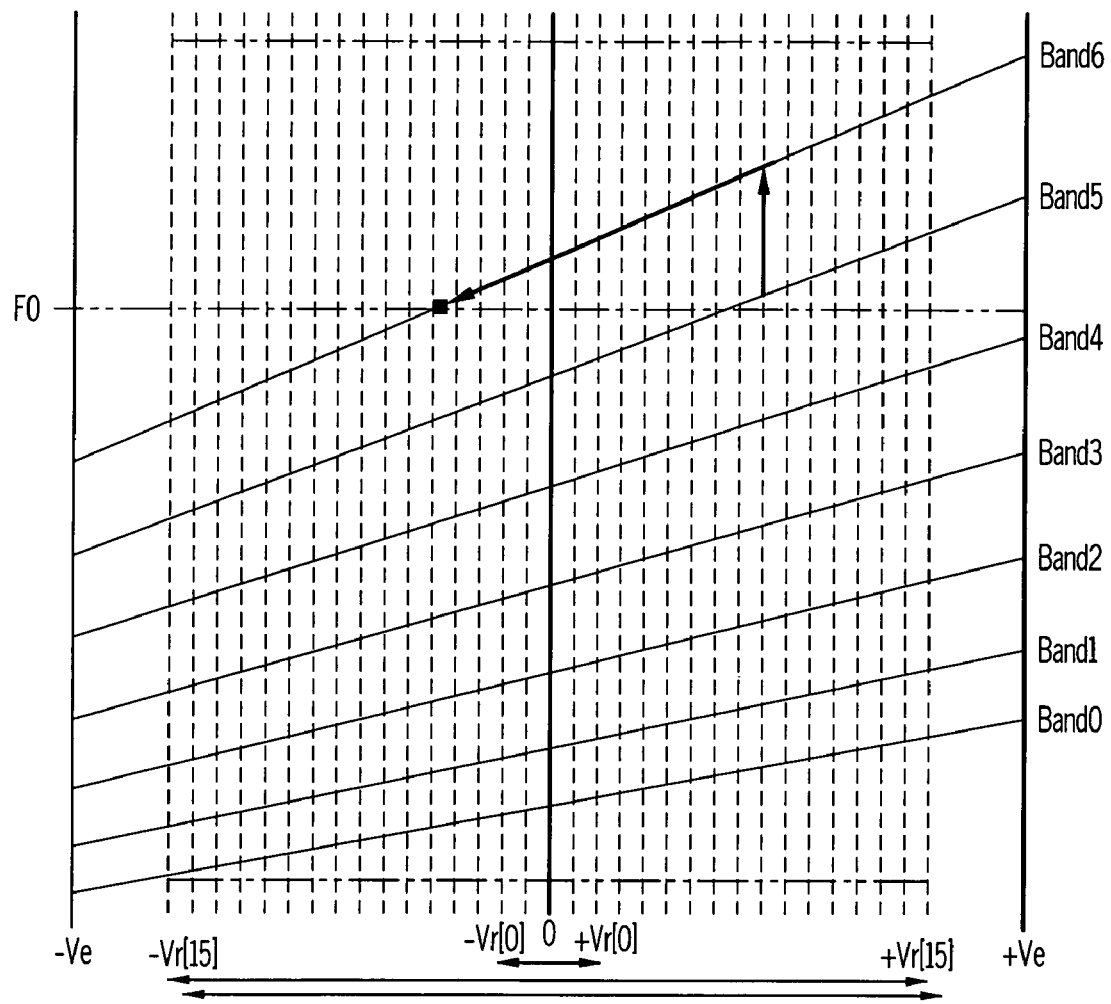
Figure 6:
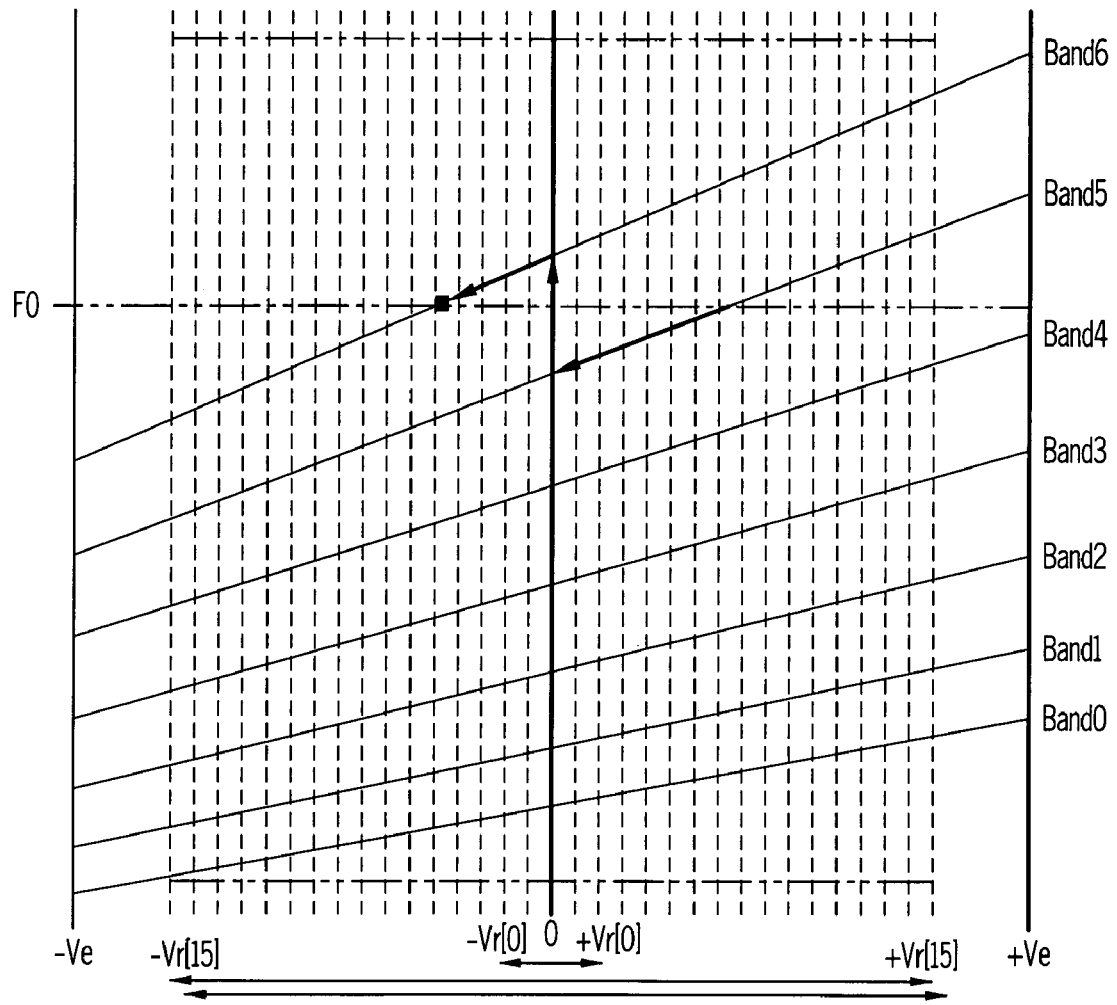

FIGS. 5 and 6 illustrate the application of the methods/mechanisms of the invention to a slightly lower frequency F0, for which calibration overshoot is corrected to a slightly negative differential control voltage. FIG. 5 provides the conventional approach illustrating the overshoot to the next band (band6). As illustrated by the graph of FIG. 6, obtained by shorting the two sides of the differential filter, the VCO calibration overshoot is corrected so that there is substantially less overshoot. In this embodiment also, the overshoot is defined as the center frequency of the top band.

Figure 7:
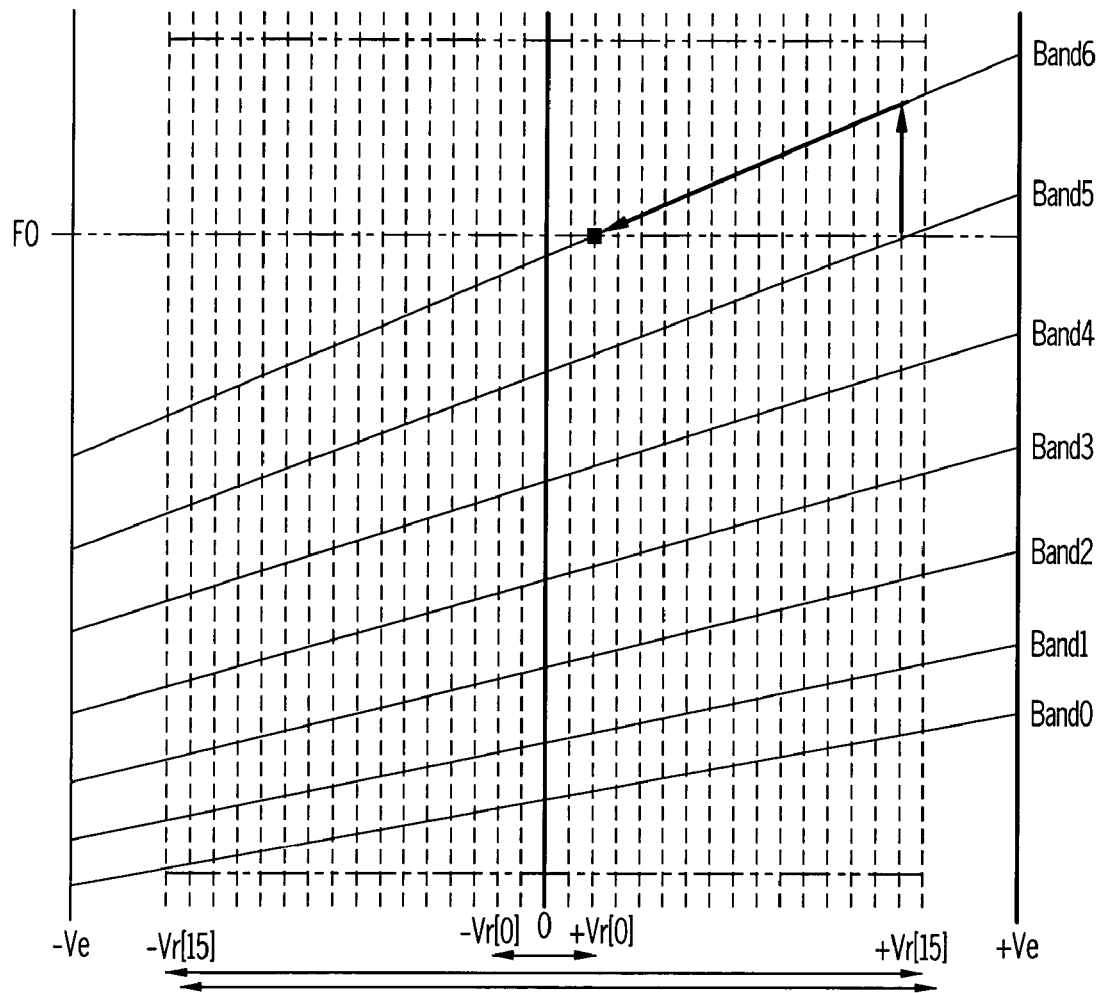
Figure 8:
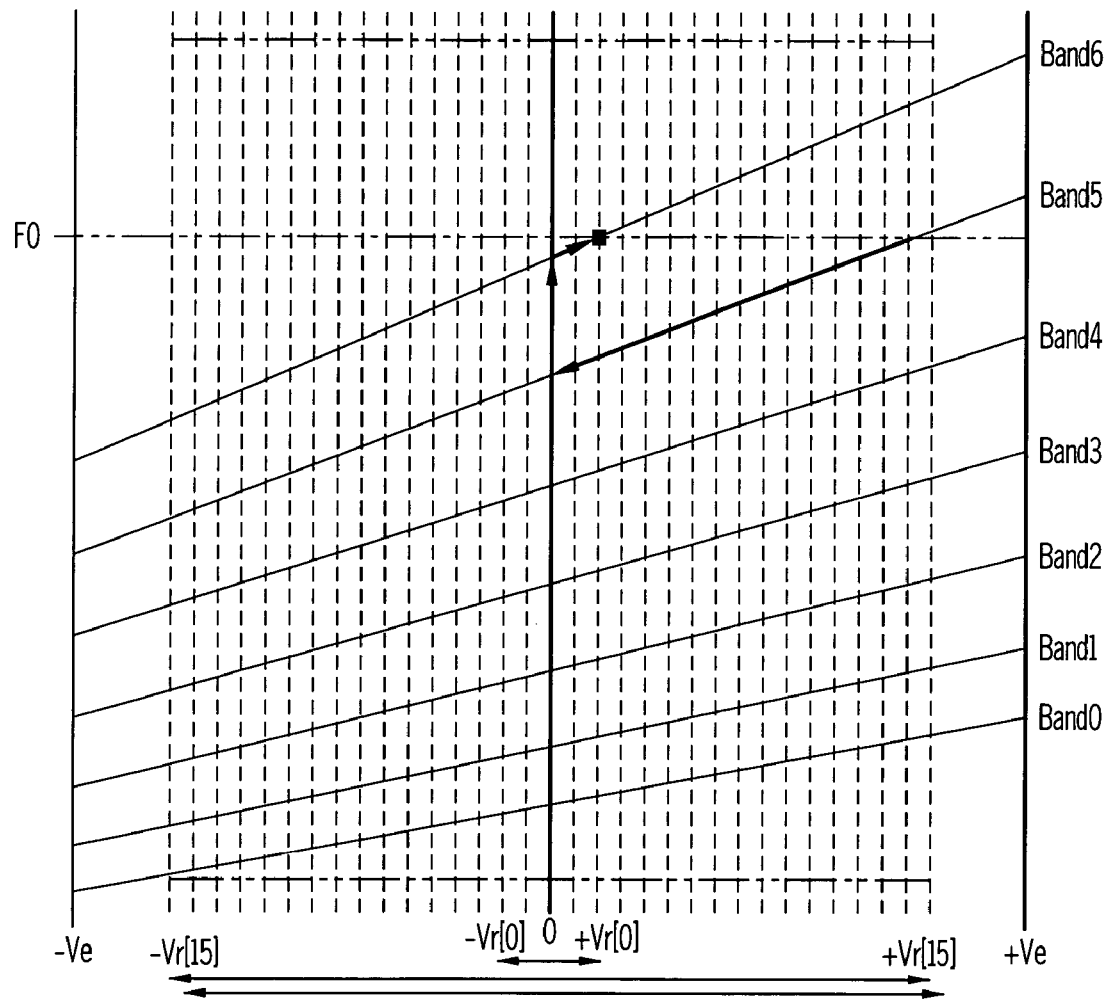

FIGS. 7 and 8 illustrate the application of the methods/mechanisms of the invention to a slightly higher frequency F0, for which calibration overshoot is corrected to a slightly positive differential control voltage. FIG. 7 provides the conventional approach illustrating the overshoot to the next band (band6). As illustrated by the graph of FIG. 8, obtained by shorting the two sides of the differential filter, the VCO calibration overshoot is corrected so that there is actually a slight undershoot (indicated by the delta between the 0 voltage axes and the point of intersection by F0 with Band6). In this embodiment also, the "overshoot" is defined as the center frequency of the top band.

While the invention has been particularly shown and described with reference to a preferred embodiment, it will be understood by those skilled in the art that various changes in form and detail may be made therein without departing from the spirit and scope of the invention.

What is claimed is:

1. In a phase lock loop (PLL) circuit device which includes a voltage controlled oscillator (VCO), a method to reduce overshoot during calibration of the PLL circuit device, comprising:

determining when calibration of the PLL circuit device is initiated, including setting a present frequency band for the PLL circuit device to a base frequency band which is a lowest frequency band among a plurality of sequentially higher frequency bands to be used with the PLL circuit device;

setting to a minimum size a smallest selection window used to determine a least amount of a differential control voltage offset from a pre-established center point reference voltage for each of the plurality of sequentially higher frequency bands to provide VCO calibration of the PLL device;

centering present frequency of the VCO to the pre-established center point reference voltage prior to stepping the present frequency band to a next higher frequency band of the plurality of sequentially higher frequency bands by shorting a differential loop filter of the PLL circuit device having positive and negative branches, such that the differential loop filter is coupled to differential inputs of the VCO, by applying a high voltage input to a gate of a filter reset transistor having a source and a drain respectively coupled to either of the differential inputs of the VCO and to respective ones of the positive and negative branches of the differential loop filter;

pausing, after the shorting of the differential loop filter for a preset time period, to allow the present VCO frequency to return to the pre-established center point reference voltage;

sampling, after the pausing for the preset time period, the differential voltage control offset for the PLL circuit device for the present frequency band and determining whether the sampled differential voltage control offset is within the smallest selection window;

stepping up the present frequency band to a next higher frequency band of the plurality of sequentially higher frequency bands in response to a determination that the sampled differential voltage control offset for the present frequency band is not within the smallest selection window, and in response to a determination that the present frequency band has not been stepped up to a maximum frequency band of the plurality of sequentially higher frequency bands; and incrementing the size of the smallest selection window by a predetermined amount if a present size of the smallest selection window is less than a preset maximum size for the smallest selection window;

wherein calibration of the PLL circuit device is completed when it is determined that the sampled differential voltage control offset for the present frequency band is within the smallest selection window for the present frequency band.

2. The method of claim 1, further comprising:
reporting an error in calibration when it is determined that the present frequency band has been stepped up to the maximum frequency band of the plurality of bands and the size of the smallest selection window is equal to the preset maximum size and without the calibration of the PLL circuit device having been completed.

3. A phase lock loop (PLL) electronic circuit device, comprising:
a voltage controlled oscillator (VCO) having differential positive and negative inputs and an output;
a charge pump having differential outputs coupled to the differential inputs of the VCO;
a differential loop filter having positive and negative branches, such that the differential loop filter is coupled to the differential inputs of the VCO;
a filter reset transistor having a gate, a source and a drain, such that the source and drain are coupled respectively to either of the differential inputs of the VCO and to respective ones of positive and negative branches of the differential loop filter;
a divider, which includes a divide-by-N circuit, where N is an integer selected to enable the divider to correctly divide a frequency generated by a signal which propagates through a feedback path disposed between the VCO output and an input of the charge pump;
means for determining when calibration of the PLL electronic circuit device is initiated, including means for setting a present frequency band for the PLL electronic circuit device to a base frequency band which is a lowest frequency band among a plurality of sequentially higher frequency bands to be used with the PLL electronic circuit device;

means for setting to a minimum size a smallest selection window used to determine a least amount of a differential control voltage offset from a pre-established center point reference voltage for each of the plurality of sequentially higher frequency bands;

means for centering a present frequency of the VCO to the pre-established center point reference voltage prior to stepping the present frequency to a next higher frequency band of the plurality of sequentially higher frequency bands by shorting the positive and negative branches of the differential loop filter together by applying a high voltage input to the gate of the filter reset transistor;

means for pausing, after the shorting of the positive and negative branches of the differential loop filter, for a preset time period to allow the present VCO frequency to return to the pre-established center point reference voltage;

means for sampling, after the pausing for the preset time period, the differential voltage control offset for the PLL electronic circuit device for the present frequency band and determining whether the sampled differential voltage control offset is within the smallest selection window;

means for stepping up the present frequency band to a next higher frequency band of the plurality of sequentially higher frequency bands in response to a determination that the differential voltage control offset sampled by the sampling means for the present frequency band is not within the smallest selection window, and in response to a determination that the present frequency band has not been stepped up to a maximum frequency band of the plurality of sequentially higher frequency bands; and means for incrementing the size of the smallest selection window by a predetermined amount if a present size of the smallest selection window is less than a preset maximum size for the smallest selection window, wherein calibration of the PLL electronic circuit device is completed when it is determined that the sampled differential voltage control offset for the present frequency band is within the smallest selection window for the present frequency band.

4. The device of claim 3, further comprising means for:
means for reporting an error in calibration when it is determined that the present frequency band has been stepped up to the maximum frequency band of the plurality of sequentially higher frequency bands and the size of the smallest selection window is equal to a maximum size and without calibration of the PLL electronic circuit device having been completed.

5. A VCO calibration circuit, comprising the components of the device of claim 3.

6. A frequency multiplier phase locked loop (PLL) electronic device comprising, the components of the device of claim 3.

7. A computer system, comprising a phase locked loop (PLL) electronic device configured according to the device of claim 3.

8. The device of claim 3, further comprising:
a phase frequency detector having an input coupled to the feedback path and an output coupled to one of the differential inputs of the charge pump.

* * * * *